United States Patent
Norley et al.

(10) Patent No.: US 6,777,086 B2
(45) Date of Patent: Aug. 17, 2004

(54) LAMINATES PREPARED FROM IMPREGNATED FLEXIBLE GRAPHITE SHEETS

(76) Inventors: Julian Norley, 17635 Plum Creek Trail, Chagrin Falls, OH (US) 44023; John Joseph Brady, 6117 Parkridge Ave., Cleveland, OH (US) 44144; George Getz, 6538 Mariana Dr., Parma Heights, OH (US) 44130; Jeremy Klug, 626 Southbridge Blvd., Brunswick, OH (US) 44212

( * ) Notice: Subject to any disclaimer, the term of this patent is extended or adjusted under 35 U.S.C. 154(b) by 0 days.

(21) Appl. No.: 09/943,131

(22) Filed: Aug. 31, 2001

(65) Prior Publication Data

US 2003/0044614 A1 Mar. 6, 2003

(51) Int. Cl.⁷ .............................. B32B 9/00
(52) U.S. Cl. ..................................... 428/408
(58) Field of Search .................................. 428/408

(56) References Cited

U.S. PATENT DOCUMENTS

| | | | |
|---|---|---|---|
| 3,404,061 A | * 10/1968 | Shane et al | |
| 4,014,730 A | 3/1977 | Selover et al. | 156/331 |
| 4,023,079 A | 5/1977 | Selover et al. | 361/433 |
| 4,216,266 A | 8/1980 | Hirschvogel et al. | 428/408 |
| 4,226,821 A | 10/1980 | Ishikawa et al. | 264/134 |
| 4,516,782 A | 5/1985 | Usher | 277/1 |
| 4,541,411 A | 9/1985 | Woolf | 126/390 |
| 4,607,851 A | 8/1986 | Usher | 277/1 |
| 4,799,956 A | 1/1989 | Vogel | 75/243 |
| 4,808,481 A | 2/1989 | Luxon | 428/407 |
| 4,818,469 A | 4/1989 | Supik | 376/203 |
| 4,870,256 A | 9/1989 | Heise et al. | 219/542 |
| 4,961,991 A | 10/1990 | Howard | 428/246 |
| 5,128,209 A | 7/1992 | Sakai et al. | 428/421 |
| 5,134,030 A | 7/1992 | Ueda et al. | 428/365 |
| 5,192,605 A | 3/1993 | Mercuri et al. | 428/224 |
| 5,198,063 A | 3/1993 | Howard et al. | 156/282 |
| 5,201,532 A | 4/1993 | Salesky et al. | 277/124 |
| 5,240,769 A | 8/1993 | Ueda et al. | 428/365 |
| 5,273,911 A | 12/1993 | Sasaki et al. | 438/62 |
| 5,300,370 A | 4/1994 | Washington et al. | 429/34 |
| 5,344,500 A | 9/1994 | Sasaki et al. | 136/258 |
| 5,441,577 A | 8/1995 | Sasaki et al. | 136/244 |
| 5,478,048 A | 12/1995 | Salesky et al. | 251/214 |
| 5,509,993 A | 4/1996 | Hirschvogel | 156/326 |
| 5,521,018 A | 5/1996 | Wilkinson et al. | 429/26 |
| 5,527,363 A | 6/1996 | Wilkinson et al. | 29/623 |
| 5,542,681 A | 8/1996 | Hutchens et al. | 277/539 |
| 5,683,778 A | 11/1997 | Crosier | 428/59 |
| 5,830,809 A | 11/1998 | Howard et al. | 442/59 |
| 5,895,058 A | 4/1999 | Sanders | 277/650 |
| 5,934,617 A | 8/1999 | Rutherford | 244/134 |
| 5,944,322 A | 8/1999 | Coff et al. | 277/594 |
| 6,027,807 A | 2/2000 | Inoue et al. | 428/408 |
| 6,060,166 A | 5/2000 | Hoover et al. | 428/408 |
| 6,092,811 A | 7/2000 | Bojarczuk et al. | 277/627 |
| 6,194,685 B1 | 2/2001 | Rutherford | 219/201 |
| 6,270,083 B1 | 8/2001 | Hirschvogel et al. | 277/536 |
| 6,299,976 B1 | 10/2001 | Tsukamoto | 428/364 |

FOREIGN PATENT DOCUMENTS

| | | |
|---|---|---|
| EP | 440116 A2 | 8/1991 |
| EP | 672851 A2 | 9/1995 |
| EP | 0440116 B1 | 3/1996 |
| GB | 2285067 | 6/1995 |
| JP | 63319147 | 12/1988 |
| JP | 4212841 | 8/1992 |
| JP | 00021422 | 1/2000 |

OTHER PUBLICATIONS

Author: Riffle, Linda (UCAR Carbon)—Comp., Title: Gaskets of Graphite or Expanded Graphite Laminated With Metal; Search of the WPAT Database from 1976–1990., Parma, OH, Oct. 20, 1992, NP.

Author: Howard, R.A. (UCC, Carbon Products Div.), Title: Grafoil—Engineering Design Manual; vol. 1, Sheet and Laminate Products, Parma, OH, UCC C1987, 60p.

* cited by examiner

Primary Examiner—Abraham Bahta
(74) Attorney, Agent, or Firm—Waddey & Patterson; James R. Cartiglia

(57) ABSTRACT

Laminates are prepared from resin-impregnated flexible graphite sheets. Impregnated sheets are calendered and layers of the calendered sheets, which may also be coated with a resin adhesive, are stacked into structures which optionally contains layers of metals or plastics. After curing at elevated temperature and pressure, 2500 psi and 150° C., the laminates form dense machinable structures suitable for uses such as electronic thermal management (ETM) devices.

27 Claims, No Drawings

LAMINATES PREPARED FROM IMPREGNATED FLEXIBLE GRAPHITE SHEETS

TECHNICAL FIELD

This invention relates to laminates prepared from resin impregnated flexible graphite sheets. The laminates, which may also include layers of other materials such as metals and plastics, are cured under heat and pressure and are machinable structures useful in applications such as heat transporters used in electronic thermal management (ETM).

BACKGROUND OF THE INVENTION

Laminates in which one or more of the layers consist of flexible graphite sheets are known in the art. These structures find utility, for example, in gasket manufacture. See U.S. Pat. No. 4,961,991 to Howard. Howard discloses various laminate structures which contain metal or plastic sheets, bonded between sheets of flexible graphite. Howard discloses that such structures can be prepared by cold-working a flexible graphite sheet on both sides of a metal net and then press-adhering the graphite to the metal net. Howard also discloses placing a polymer resin coated cloth between two sheets of flexible graphite while heating to a temperature sufficient to soften the polymer resin, thereby bonding the polymer resin coated cloth between the two sheets of flexible graphite to produce a flexible graphite laminate. Similarly, Hirschvogel, U.S. Pat. No. 5,509,993, discloses flexible graphite/metal laminates prepared by a process which involves as a first step applying a surface active agent to one of the surfaces to be bonded. Mercuri, U.S. Pat. No. 5,192,605, also forms laminates from flexible graphite sheets bonded to a core material which may be metal, fiberglass or carbon. Mercuri deposits and then cures a coating of an epoxy resin and particles of a thermoplastic agent on the core material before feeding core material and flexible graphite through calender rolls to form the laminate.

In addition to their utility in gasket materials, graphite laminates also find utility as heat transfer or cooling apparatus. The use of various solid structures as heat transporters is known in the art. For example, Banks, U.S. Pat. Nos. 5,316,080 and 5,224,030 discloses the utility of diamonds and gas-derived graphite fibers, joined with a suitable binder, as heat transfer devices. Such devices are employed to passively conduct heat from a source, such as a semiconductor, to a heat sink.

Graphite layered thermal management components offer several advantages in electronic applications and can help eliminate the potential negative impacts of heat generating components in computers, communications equipment, and other electronic devices. Graphite based thermal management components include heat sinks, heat pipes and heat spreaders. All offer thermal conductivity equivalent to or better than copper or aluminum, but are a fraction of the weight of those materials, and provide significantly greater design flexibility. Graphite based thermal management products take advantage of the highly directional properties of graphite to move heat away from sensitive components. Compared to typical aluminum alloys used for heat management, graphite components can exhibit up to 300% higher thermal conductivity, with values comparable to copper (~400 watts per meter degree Kelvin, i.e., W/mC) or greater attainable. Further, aluminum and copper are isotropic, making it impossible to channel the heat in a preferred direction.

The flexible graphite preferred for use in the laminate of this invention is flexible graphite sheet material.

The following is a brief description of graphite and the manner in which it is typically processed to form flexible sheet materials. Graphite, on a microscopic scale, is made up of layer planes of hexagonal arrays or networks of carbon atoms. These layer planes of hexagonally arranged carbon atoms are substantially flat and are oriented or ordered so as to be substantially parallel and equidistant to one another. The substantially-flat, parallel, equidistant sheets or layers of carbon atoms, usually referred to as graphene layers or basal planes, are linked or bonded together and groups thereof are arranged in crystallites. Highly-ordered graphite materials consist of crystallites of considerable size, the crystallites being highly aligned or oriented with respect to each other and having well ordered carbon layers. In other words, highly ordered graphites have a high degree of preferred crystallite orientation. It should be noted that graphites, by definition, possess anisotropic structures and thus exhibit or possess many characteristics that are highly directional, e.g., thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be chemically treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been chemically or thermally expanded and more particularly expanded so as to have a final thickness or "c" direction dimension which is as much as about 80 or more times the original "c" direction dimension, can be formed without the use of a binder into cohesive or integrated sheets of expanded graphite, e.g. webs, papers, strips, tapes, or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy to thermal and electrical conductivity and fluid diffusion, somewhat less, but comparable to the natural graphite starting material due to orientation of the expanded graphite particles substantially parallel to the opposed faces of the sheet resulting from very high compression, e.g. roll processing. Sheet material thus produced has excellent flexibility, good strength and a very high degree or orientation. There is a need for processing that more fully takes advantage of these properties.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance will, once compressed, maintain the compression set and alignment with the opposed major surfaces of the sheet. Properties of the sheets may be altered by coatings and/or the addition of binders or additives prior to the compression step. See U.S. Pat. No. 3,404,061 to Shane, et al. The density and thickness of the sheet material can be varied by controlling the degree of compression.

Lower densities are advantageous where surface detail requires embossing or molding, and lower densities aid in achieving good detail. However, higher in-plane strength, thermal conductivity and electrical conductivity are generally favored by more dense sheets. Typically, the density of the sheet material will be within the range of from about 0.04 $cm^3$ to about 1.4 $cm^3$.

Flexible graphite sheet material made as described above typically exhibits an appreciable degree of anisotropy due to the alignment of graphite particles parallel to the major opposed, parallel surfaces of the sheet, with the degree of anisotropy increasing upon roll pressing of the sheet material to increased density. In roll-pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude typically, for the "c" and "a" directions.

SUMMARY OF THE INVENTION

It is an object of the invention to provide a machinable laminate of resin impregnated graphite sheets suitable for use in electronic thermal management (ETM).

It is a further object of the invention to provide a high density graphite laminate utilizing relatively modest curing pressures.

It is a further object of this invention to provide laminated graphite structures having enhanced in-plane properties.

It is a further object of the invention to provide a machinable graphite laminate structure having relatively high thermal conductivity in the "a" directions and relatively low conductivity in the "c" direction.

These and other objects are accomplished by the present invention, which provides a machinable structure comprising layers of epoxy impregnated flexible graphite together with optional layers of metals or non-metallic materials including plastics.

DETAILED DESCRIPTION OF THE INVENTION

This invention is based upon the finding that when flexible sheets of epoxy impregnated graphite are calendered, stacked and cured at elevated temperatures and pressures, the resultant laminate is of unexpectedly good mechanical and thermal properties and also possesses good machinability.

Before describing the manner in which the invention improves current materials, a brief description of graphite and its formation into flexible sheets, which will become the primary substrate for forming the products of the invention, is in order.

PREPARATION OF FLEXIBLE GRAPHITE FOIL

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms, and are sometimes referred to herein as "particles of expanded graphite." The worms may be compressed together into flexible sheets that, unlike the original graphite flakes, can be formed and cut into various shapes and provided with small transverse openings by deforming mechanical impact.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be intercalated and exfoliated, is suitable for use with the present invention. Such graphite preferably has an ash content of less than twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. The intercalation solution may also contain metal halides such as ferric chloride, and ferric chloride mixed with sulfuric acid, or a halide, such as bromine, as a solution of bromine and sulfuric acid or bromine, in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1,10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms, and are sometimes referred herein as "particles of expanded graphite." The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.4 grams per cubic centimeter ($g/cm^3$).

The individual layers of graphite within the flexible graphite sheet are not stacked close enough and with the proper crystal stacking sequence to have the same degree of orientation as single crystals of graphite. Therefore, this material has only limited thermal conductivity in the plane of the sheet. Single crystals of graphite will exhibit a thermal conductivity of about 2000 W/mC in plane and 10 out of plane. Flexible graphite sheets of the sort above described have a thermal conductivity of about 100–250 W/mC in plane and about 6–9 W/mC out of plane.

According to the invention, flexible graphite sheets prepared as described above and having a thickness of about 4 mm to 7 mm are impregnated with a thermosetting resin such as an epoxy, acrylic or phenolic resin system. Suitable epoxy resins include diglycidyl ether of bisphenol A (DGEBA) resin systems; other multifunctional epoxy resins systems are also suitable for use in the present invention. Suitable phenolic resin systems include those containing resole and novolak resins. The sheets are then calendered to a thickness of about 0.35 mm to 0.5 mm, at which time the calendered, epoxy impregnated flexible mats have a density of about 1.4 $g/cm^3$ to about 1.9 $g/cm^3$.

The amount of resin within the epoxy impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 3% by weight, more preferably from about 5% to about 35% by weight depending on the characteristics desired in the final product.

In a typical resin impregnation step, the flexible graphite sheet is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite sheet. The resin is thereafter preferably dried, reducing the tack of the resin and the resin-impregnated sheet.

One form of apparatus for continuously forming resin-impregnated and calendered flexible graphite sheet is shown in International Publication No. WO 00/64808, the disclosure of which is incorporated herein by reference.

Following the calendering step, the impregnated sheets are cut to suitable-sized pieces which are stacked together and placed in a press, where they are cured at an elevated temperature. The temperature should be sufficient to ensure that the lamellar structure is densified at the curing pressure, while the thermal properties of the structure are not adversely impacted. Generally, this will require a temperature of from about 150° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be from 1000 to 3000 pounds per square inch (psi). The curing time may vary depending on the resin system and the temperature and pressure employed, but generally will range from 0.5 hours to 2 hours. After curing is complete, the composites are seen to have a density of from about 1.8 $g/cm^3$ to 2.0 $g/cm^3$.

Advantageously, the resin present in the impregnated sheets can act as the adhesive for the composite material. According to another embodiment of the invention, however, the calendered, impregnated, flexible graphite sheets are coated with an adhesive before the flexible sheets are stacked and cured. Suitable adhesives include epoxy-, acrlylic- and phenolic-based resins. Phenolic resins found especially useful in the practice of the present invention include phenolic-based resin systems including resole and novolak phenolics.

According to another embodiment of the invention, non-graphite layers may be included in the pre-pressed stack. Such non-graphite layers may include metals, plastics or other non-metallics such as fiberglass or ceramics. The epoxy polymer in the impregnated graphite sheets is sufficient to, upon curing, adhesively bond the non-graphite as well as the impregnated graphite layers of the structure into place.

The following examples are presented to further illustrate and explain the invention and are not intended to be limiting in any regard. Unless otherwise indicated, all parts and percentages are by weight.

EXAMPLE 1

Graphite sheets with a weight per unit area of 70 $mg/cm^2$ with dimensions of approximately 30 cm by 30 cm were impregnated with epoxy such that the resulting calendered mats were 12 weight % epoxy. The epoxy employed was a diglycidyl ether of bisphenol A (DGEBA) elevated temperature cure formulation and the impregnation procedures involved saturation with an acetone-resin solution followed by drying at approximately 80° C. Following impregnation, the sheets were then calendered from a thickness of approximately 7 mm to a thickness of approximately 0.4 mm and a density of 1.63 $g/cm^3$.

The calendered, impregnated sheets were then cut into disks with a diameter of approximately 50 mm and the disks were stacked 46 layers high. This stack of disks was then placed in a TMP (Technical Machine Products) press, and cured at 2600 psi at 150° C. for 1 hour.

The resultant laminate had a density of 1.90 $g/cm^3$, a flexural strength of 8000 psi, a Young's modules of 7.5 Msi (millions of pounds per square inch) and an in plane resistivity of 6 microhm. The in-plane and through-thickness thermal conductivity values were 396 W/mC and 6.9 W/mC, respectively. The laminates exhibited superior machinability, had a continuous pore free surface with a smooth finish and were suitable for use in electronic thermal management devices. These properties have not been elsewhere reported for laminates based on flexible graphite.

The highly anisotropic thermal conductivity resulted in a structure highly adapted for use in piping heat away from sensitive electronics and into a heat sink. In addition, the density of the material, approximately 1.94 g/cm³, is considerably below aluminum (2.7 g/cm³) and much less than copper (8.96 g/cm³). Thus, the specific thermal conductivity (that is, the ratio of thermal conductivity to density) of the graphite laminate is about five times that of aluminum and about four to six times that of copper.

EXAMPLE 2

Using the procedure described above, a 23-ply graphite laminate (6 wt % epoxy) was constructed with a 0.025 mm thick outside copper cladding. The cladding was added to the laminate as an outer layer of cut metal. The epoxy impregnated graphite layers within the clad structure were assembled without the aid of an additional resin adhesive. The resulting clad laminate cured well and was machinable. The polymer in the epoxy impregnated graphite sheets was sufficient to adhesively bond the copper cladding in place.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. A resin/graphite laminate comprising multiple sheets of resin impregnated flexible graphite cured at an elevated temperature and a pressure of from 1000 psi to 5000 psi.

2. The laminate of claim 1 wherein the resin is an epoxy.

3. The laminate of claim 1 wherein the sheets of resin impregnated graphite are glued together with a phenolic-based adhesive prior to being pressure cured at an elevated temperature.

4. The laminate of claim 1 wherein the multiple sheets are pressure cured at a temperature of from 90° C. to 200° C.

5. The laminate of claim 1 wherein the density of the cured laminate is greater than about 1.85 g/cm³.

6. A resin/graphite laminate comprising layers of resin impregnated flexible graphite sheets together with layers of a non-graphite material, wherein the laminate is cured at an elevated temperature, and a pressure of from 1000 psi to 5000 psi.

7. The laminate of claim 6 wherein the resin is epoxy.

8. The laminate of claim 6 wherein the non-graphite material is selected from the group consisting of copper, aluminum and plastics.

9. The laminate of claim 6 wherein the laminate is cured at a temperature of below about 200° C.

10. An electronic thermal management device comprising a lamellar structure comprising sheets of resin impregnated flexible graphite cured at an elevated temperature and a pressure of from 1000 psi to 5000 psi.

11. The device of claim 10 wherein the lamellar structure is cured at a temperature of from 90° C. to 200° C.

12. The device of claim 10, wherein the device exhibits a thermal conductivity which is anisotropic in nature and is greater than 100 W/mC in at least one plane.

13. The device of claim 12 wherein the anisotropic thermal conductivity varies by a factor of at least 15 as between a plane with a higher thermal conductivity and a plane with lower thermal conductivity.

14. The device of claim 10 wherein the pressure cured lamellar structure has a density greater than about 1.85 g/cm³.

15. The electronic thermal management device of claim 10 wherein the sheets of flexible graphite have a resin content of at least about 3% by weight.

16. An anisotropic electronic thermal management device having a thermal conductivity of greater than about 300 W/mC in an in plane direction and a thermal conductivity of less than about 10 W/mC in an out of plane direction and comprising resin impregnated sheets of flexible cured at a pressure of from 1000 psi to 5000 psi.

17. The electronic thermal management device of claim 16 wherein the resin is epoxy.

18. The electronic thermal management device of claim 16 wherein the resin impregnated sheets form a lamellar structure having a density of at least 1.85 g/cm³.

19. The electronic thermal management device of claim 16 wherein the resin impregnated sheets of flexible graphite have been cured at an elevated temperature and pressure to form a lamellar structure.

20. The resin/graphite laminate of claim 1 wherein said resin content comprises no more than 20% by weight.

21. The resin/graphite laminate of claim 1 wherein said resin content comprises no more than 25% by weight.

22. The resin/graphite laminate of claim 1 wherein the sheets of flexible graphite have a resin content of from about 5% to about 35% by weight.

23. A resin/graphite laminate comprising multiple sheets of resin impregnated flexible graphite cured at an elevated temperature and a pressure of at least about 1000 psi.

24. The laminate of claim 23 wherein the resin is an epoxy.

25. The laminate of claim 23 wherein the sheets of resin impregnated graphite are glued together with a phenolic-based adhesive prior to being cured.

26. The laminate of claim 23 wherein the multiple sheets are pressure cured at a temperature of at least about 90° C.

27. The laminate of claim 23 wherein the density of the cured laminate is greater than about 1.85 g/cm³.

* * * * *